United States Patent
Yang et al.

(10) Patent No.: US 9,577,613 B2
(45) Date of Patent: Feb. 21, 2017

(54) DUAL LOOP VOLTAGE REGULATOR BASED ON INVERTER AMPLIFIER AND VOLTAGE REGULATING METHOD THEREOF

(71) Applicants: Junhyeok Yang, Seongnam-Si (KR); Dae-Yong Kim, Seoul (KR); Sungmin Yoo, Seoul (KR)

(72) Inventors: Junhyeok Yang, Seongnam-Si (KR); Dae-Yong Kim, Seoul (KR); Sungmin Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/961,526

(22) Filed: Dec. 7, 2015

(65) Prior Publication Data

US 2016/0173066 A1    Jun. 16, 2016

(30) Foreign Application Priority Data

Dec. 11, 2014 (KR) .................. 10-2014-0178639

(51) Int. Cl.

| | |
|---|---|
| *G11C 5/14* | (2006.01) |
| *H03K 3/012* | (2006.01) |
| *H03K 17/687* | (2006.01) |
| *G05F 1/56* | (2006.01) |
| *H03K 19/00* | (2006.01) |
| *H03K 19/017* | (2006.01) |

(52) U.S. Cl.
CPC ............ *H03K 3/012* (2013.01); *G05F 1/56* (2013.01); *H03K 17/687* (2013.01); *H03K 19/0013* (2013.01); *H03K 19/01714* (2013.01)

(58) Field of Classification Search
USPC .......................................... 327/530, 538–543
See application file for complete search history.

(56) References Cited

U.S. PATENT DOCUMENTS

| | | | |
|---|---|---|---|
| 6,838,934 B2 | 1/2005 | Suzuki et al. | |
| 6,977,558 B2 * | 12/2005 | Cranford, Jr. | ............ H03L 7/08 |
| | | | 327/540 |
| 7,141,956 B2 | 11/2006 | Chapuis | |
| 7,253,595 B2 | 8/2007 | Oddoart et al. | |
| 7,554,310 B2 * | 6/2009 | Chapuis | ............... H02M 3/157 |
| | | | 323/282 |

(Continued)

FOREIGN PATENT DOCUMENTS

| | | |
|---|---|---|
| JP | 2000-353923 | 12/2000 |
| JP | 2008-022623 | 1/2008 |

(Continued)

OTHER PUBLICATIONS

Robert J. Milliken et al., "Full On-Chip CMOS Low-Dropout Voltage Regulator", IEEE Transactions on Circuits and Systems—I: Regular Papers, vol. 54, No. 9, Sep. 2007, pp. 1879-1890.

*Primary Examiner* — Adam Houston
(74) *Attorney, Agent, or Firm* — Volentine & Whitt, PLLC

(57) ABSTRACT

A voltage regulator includes a pass element, a buffer, and an error amplifier. The voltage regulator further includes a fast push-pull driver that has an inverter type amplification structure, is connected between a power output and a control input of the pass element, and reduces positive and negative peaks of the power output at a speed faster than a speed of a main feedback loop.

20 Claims, 15 Drawing Sheets

(56) References Cited

U.S. PATENT DOCUMENTS

| | | | |
|---|---|---|---|
| 7,560,974 B2 | 7/2009 | Noh et al. | |
| 8,482,342 B2* | 7/2013 | Conte | G05F 3/30 |
| | | | 323/313 |
| 8,593,216 B2* | 11/2013 | Zhang | H03H 7/06 |
| | | | 327/157 |
| 8,841,893 B2* | 9/2014 | Bulzacchelli | G05F 1/575 |
| | | | 323/280 |
| 9,019,005 B2* | 4/2015 | Feldtkeller | G05F 1/56 |
| | | | 327/540 |
| 2009/0121912 A1* | 5/2009 | Zanchi | H03M 1/0863 |
| | | | 341/172 |
| 2011/0089990 A1 | 4/2011 | Wimpenny | |
| 2011/0102058 A1* | 5/2011 | Conte | G05F 3/30 |
| | | | 327/512 |
| 2012/0013396 A1* | 1/2012 | Morino | G05F 3/24 |
| | | | 327/540 |
| 2013/0082672 A1* | 4/2013 | Kim | G05F 1/575 |
| | | | 323/280 |

FOREIGN PATENT DOCUMENTS

| | | |
|---|---|---|
| KR | 1020070024068 | 3/2007 |
| KR | 1020130034852 A | 4/2013 |

* cited by examiner

DUAL LOOP VOLTAGE REGULATOR BASED ON INVERTER AMPLIFIER AND VOLTAGE REGULATING METHOD THEREOF

CROSS-REFERENCE TO RELATED APPLICATIONS

A claim for priority under 35 U.S.C. §119 is made to Korean Patent Application No. 10-2014-0178639 filed Dec. 11, 2014, in the Korean Intellectual Property Office, the entire contents of which are hereby incorporated by reference.

BACKGROUND

Embodiments of the disclosure described herein relate to a power supply device, and more particularly, relate to a voltage regulator easily incorporated on-chip.

As high-end mobile devices such as a smart phone, a tablet PC, etc., are developed, various attempts are being made for improvement of performance, cost reduction, and decrease in defect rate.

As one of such attempts, a study on low-power consumption is being made to use a battery of a mobile device longer. Moreover, a study on supplying of power to an electronic device in a mobile device is being made to secure a reliable operation of the mobile device.

A low drop-out voltage regulator supplies power to an electronic device such as an application processor or a memory controller in a system on chip and must have a function of maintaining a constant power output regardless of a variation in a power input or a variation in a load current.

The low drop-out voltage regulator is a type of voltage regulator in which a level difference between an input voltage and an output voltage is relatively small.

Ripple occurs at an output voltage of the voltage regulator when a current consumed by an electronic device in a chip is sharply varied. A relatively great capacitance of a capacitor is installed inside or outside the chip to stabilize an output voltage by reducing the ripple, thereby increasing production cost and increasing a defect rate.

SUMMARY

Embodiments of the disclosure provide a voltage regulator well-suited for on-chip integration.

Embodiments of the disclosure provide a low drop-out voltage regulator capable of reducing or minimizing overshoot or undershoot generated due to a load variation within a short time.

Embodiments of the disclosure provide a voltage regulator and a voltage regulating method capable of providing a fast response and a stable power output even when used without cooperation of a capacitor.

One aspect of embodiments of the disclosure is directed to provide a voltage regulator which includes a pass element, a buffer, an error amplifier, and a fast push-pull driver. The pass element may have a power input connected to a voltage source, a power output connected to a load, and a control input. The buffer may have an input and have an output connected to the control input of the pass element. The error amplifier may form a first feedback loop together with the pass element and the buffer and may have a positive input connected to a sampled voltage of the power output of the pass element, a negative input connected to a reference voltage, and an output connected to the input of the buffer. The fast push-pull driver may be connected between the power output and the control input of the pass element in an inverter type amplification structure and may reduce a negative peak and a positive peak of the power output due to a variation in the load at a speed faster than a voltage regulating speed of the first feedback loop.

The fast push-pull driver may form a second feedback loop together with the pass element. An operating speed of the second feedback loop is faster than an operating speed of the first feedback loop.

The fast push-pull driver may include a first amplifier of an inverter type and configured to generate an inverting output in response to the power output of the pass element; and a second amplifier of an inverter type and configured to generate a push driving current or a pull driving current for controlling a voltage level of the control input in response to the inverting output.

The fast push-pull driver may further include a high-pass filter connected to the power output of the pass element and configured to perform alternating current (AC) coupling.

The first amplifier may include a first PMOS transistor having a source connected to a power supply voltage, a gate connected to the power output, and a drain connected to the inverting output; and a first NMOS transistor having a drain connected to the inverting output, a gate connected to the power output, and a source connected to a ground voltage. The second amplifier may include a second PMOS transistor having a source connected to the power supply voltage, a gate connected to the inverting output, and a drain connected to the control input; and a second NMOS transistor having a drain connected to the control input, a gate connected to the inverting output, and a source connected to the ground voltage.

The first amplifier may include a first current source connected to a power supply voltage; a first PMOS transistor having a source connected to an output of the first current source, a gate connected to the power output, and a drain connected to the inverting output; a first NMOS transistor having a drain connected to the inverting output and a gate connected to the power output; and a second current source connected between a source of the first NMOS transistor and a ground voltage. The second amplifier may include a third current source connected to the power supply voltage; a second PMOS transistor having a source connected to an output of the second current source, a gate connected to the inverting output, and a drain connected to the control input; a second NMOS transistor having a drain connected to the control input and a gate connected to the inverting output; and a fourth current source connected between a source of the second NMOS transistor and the ground voltage.

The first amplifier may include a first PMOS transistor having a source connected to a power supply voltage and a gate connected to the power output; a third PMOS transistor having a source connected to a drain of the first PMOS transistor, a gate connected to the power output, and a drain connected to the inverting output; a first NMOS transistor having a gate connected to the power output and a source connected to a ground voltage; and a third NMOS transistor having a drain connected to the inverting output, a gate connected to the power output, and a source connected to a drain of the first NMOS transistor. The second amplifier may include a second PMOS transistor having a source connected to the power supply voltage and a gate connected to the inverting output; a fourth PMOS transistor having a source connected to a drain of the second PMOS transistor, a gate connected to the inverting output, and a drain connected to the control input; a second NMOS transistor having a gate connected to the inverting output and a source connected to the ground voltage; and a fourth NMOS transistor having a drain connected to the control input, a gate connected to the inverting output, and a source connected to a drain of the second NMOS transistor.

The first amplifier may include a first PMOS transistor having a source connected to a power supply voltage and a gate connected to the power output; a third PMOS transistor having a source connected to a drain of the first PMOS transistor, a gate connected to a first control voltage, and a drain connected to the inverting output; a first NMOS transistor having a gate connected to the power output and a source connected to a ground voltage; and a third NMOS transistor having a drain connected to the inverting output, a gate connected to a second control voltage, and a source connected to a drain of the first NMOS transistor. The second amplifier may include a second PMOS transistor having a source connected to the power supply voltage and a gate connected to the inverting output; a fourth PMOS transistor having a source connected to a drain of the second PMOS transistor, a gate connected to the first control voltage, and a drain connected to the control input; a second NMOS transistor having a gate connected to the inverting output and a source connected to the ground voltage; and a fourth NMOS transistor having a drain connected to the control input, a gate connected to the second control voltage, and a source connected to a drain of the second NMOS transistor.

The first amplifier may include a first PMOS transistor having a source connected to a power supply voltage and a gate connected to the power output; a third PMOS transistor having a source connected to a drain of the first PMOS transistor and a gate connected to the power output; a first NMOS transistor having a gate connected to the power output and a source connected to a ground voltage; and a third NMOS transistor having a drain connected to a drain of the third PMOS transistor, a gate connected to the power output, and a source connected to a drain of the first NMOS transistor. The second amplifier may include a second PMOS transistor having a source connected to the power supply voltage, a gate connected to the drain of the first PMOS transistor, and a drain connected to the control input; and a second NMOS transistor having a gate connected to the drain of the first NMOS transistor, a drain connected to the control input, and a source connected to the ground voltage.

The voltage regulator may further include a frequency compensation element connected between the power output of the pass element and an input of the buffer and configured to stabilize a frequency of a whole circuit loop.

Another aspect of embodiments of the disclosure is directed to provide a voltage regulator which includes a pass element, a buffer, an error amplifier, and a fast push-pull driver. The pass element may have a power input connected to a voltage source, a power output connected to a load, and a control input. The buffer may have an input and have an output connected to the control input of the pass element. The error amplifier may form a first feedback loop together with the pass element and the buffer and may have a positive input connected to a divided voltage of the power output of the pass element, a negative input connected to a reference voltage, and an output connected to the input of the buffer. The fast push-pull driver may be connected between the power output and the control input of the pass element in an inverter type amplification structure and may regulate the power output at a speed faster than a regulating speed of the first feedback loop while AC coupling the power output when an undershoot and an overshoot of the power output occur due to a variation in the load.

Another aspect of embodiments of the disclosure is directed to provide a low drop-out voltage regulator which includes a pass element, a voltage divider, a buffer, an error amplifier, and a fast push-pull driver. The pass element may pass a power input to a power output connected to a load in response to a voltage on a control input. The voltage divider may divide the power output according to a designated resistance ratio to generate a division output. The buffer may have an input and have an output connected to the control input of the pass element. The error amplifier may form a first feedback loop together with the pass element and the buffer and may compare and amplify a voltage of a positive input connected to the division output of the voltage divider and a voltage of a negative input connected to an input reference voltage, an output of the error amplifier being provided as an input of the buffer. The fast push-pull driver may have an inverter type amplification structure and may regulate the power output to a target voltage at a speed faster than a voltage regulating speed of the first feedback loop, when a negative peak or a positive peak deviating from the target voltage of the power output occurs due to a variation in the load.

Still another aspect of embodiments of the disclosure is directed to provide a low drop-out voltage regulator which includes a pass element, a voltage divider, a buffer, an error amplifier, and a fast push-pull driver. The pass element may pass a power input to a power output connected to a load in response to a voltage on a control input. The voltage divider may divide the power output according to a designated resistance ratio to generate a division output. The buffer may have an input and have an output connected to the control input of the pass element. The error amplifier may form a first feedback loop together with the pass element and the buffer and may compare and amplify a voltage of a positive input connected to the division output of the voltage divider and a voltage of a negative input connected to an input reference voltage. An output of the error amplifier may be provided as an input of the buffer, and the first feedback loop may have a first gain. The fast push-pull driver may form a second feedback loop, having an operating response faster than an operating response of the first feedback loop, together with the pass element and may regulate the power output to a target voltage at a speed faster than a voltage regulating speed of the first feedback loop, when a negative peak or a positive peak deviating from the target voltage of the power output occurs due to a variation in the load.

A system on chip is provided which includes an electronic device; and a voltage regulator of a capacitor-less type and configured to provide a power output needed for an operation of the electronic device. The voltage regulator may include a direct current (DC) feedback loop and an AC feedback loop. The DC feedback loop may be formed by an error amplifier and a buffer sequentially connected between a power output and a control input of a pass transistor. The AC feedback loop may be formed by a fast push-pull driver connected between the power output and the control input of the pass transistor. The AC feedback loop may regulate the power output to a target voltage at a speed faster than a voltage regulating speed of the DC feedback loop, by performing N-stage inverting amplification (N being 2 or more) when a negative peak or a positive peak occurs at a target voltage level of the power output.

A voltage regulating method is provided which includes forming a DC feedback loop by sequentially connecting an error amplifier and a buffer between a power output and a control input of a pass transistor; forming an AC feedback loop by connecting a fast push-pull driver between the power output and the control input of the pass transistor; controlling the DC feedback loop to drive the power output with a level of a target voltage; controlling the AC feedback loop at a speed faster than a regulating speed of the DC feedback loop when an undershoot occurs at the target voltage, such that a pull current is discharged from the control input; and controlling the AC feedback loop at a speed faster than the regulating speed of the DC feedback loop when an overshoot occurs at the target voltage, such that a push current is supplied to the control input.

A further aspect of embodiments of the disclosure is directed to provide a voltage regulator which forms a DC feedback loop through an error amplifier and a pass element, the voltage regulator including a fast push-pull driver for an AC feedback loop. The fast push-pull driver may include a first amplifier of an inverter type and configured to generate an inverting output in response to the power output of the pass element; and a second amplifier of an inverter type and configured to generate a push driving current or a pull driving current for controlling a voltage level of the control input of the pass element in response to the inverting output.

A further aspect of embodiments of the disclosure is directed to provide a system-on-chip voltage regulator having a voltage regulating element that regulates a voltage produced at a power output in response to a control input signal; a DC feedback loop that regulates the control input signal based upon the power output voltage; and an AC feedback loop that also regulates the control input signal based upon the power output voltage.

A further aspect of embodiments of the disclosure is directed to a method, executed by a system-on-chip, of regulating a power-supply voltage. The method includes regulating, with a voltage regulating element, a voltage produced at a power output in response to a control input signal; regulating, with a DC feedback loop, the control input signal based upon the power output voltage; and additionally regulating, with an AC feedback loop, the control input signal based upon the power output voltage.

According to an exemplary embodiment of the disclosure, it is possible to reduce or minimize overshoot or undershoot generated due to a load variation within a short time. In particular, it is possible to provide a fast response and a stable power output even with a capacitor-less type of electronic device. Thus, it is easy to mount it on a system on chip and to reduce production cost and a defect rate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
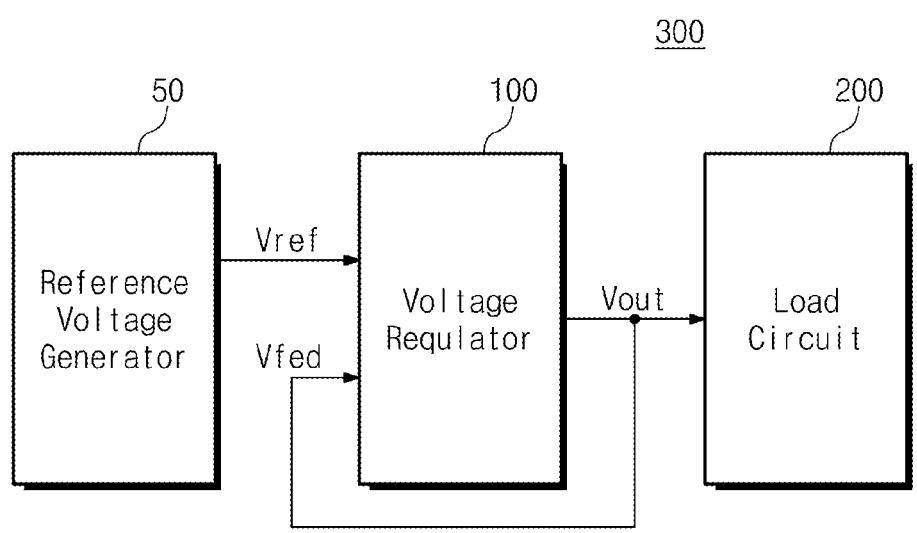
FIG. 1 is a block diagram schematically illustrating a low drop-out voltage regulator according to an exemplary embodiment of the disclosure.

Embodiments will be described in detail with reference to the accompanying drawings. The disclosure, however, may be embodied in various different forms, and should not be construed as being limited only to the illustrated embodiments. Rather, these embodiments are provided as examples so that this disclosure will be thorough and complete, and will fully convey the concept of the disclosure to those skilled in the art. Accordingly, known processes, elements, and techniques are not described with respect to some of the embodiments of the disclosure. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed herein may include their complementary embodiments. Note that a general operation of a voltage regulator of a low drop-out type and a detailed description about circuits or elements for performing the general operation may be skipped to prevent the disclosure from becoming ambiguous.

FIG. 1 is a block diagram schematically illustrating a low drop-out voltage regulator according to an exemplary embodiment of the disclosure.

Referring to FIG. 1, a voltage regulating system 300 contains a reference voltage generator 50, a voltage regulator 100, and a load circuit 200.

The voltage regulator 100 for low drop-out receives a reference voltage Vref from the reference voltage generator 50 to provide a stable power output Vout to the load circuit 200. The voltage regulator 100 receives a sampled voltage of the power output Vout as a feedback voltage Vfed. Here, the sampled voltage may be a voltage obtained by dividing the power output Vout. The voltage regulator 100 may include a noble driver (refer to FIG. 2) that regulates a voltage at fast speed when a negative peak or a positive peak is generated at an output voltage level of the power output Vout due to sudden power consumption of the load circuit 200.

Figure 2:
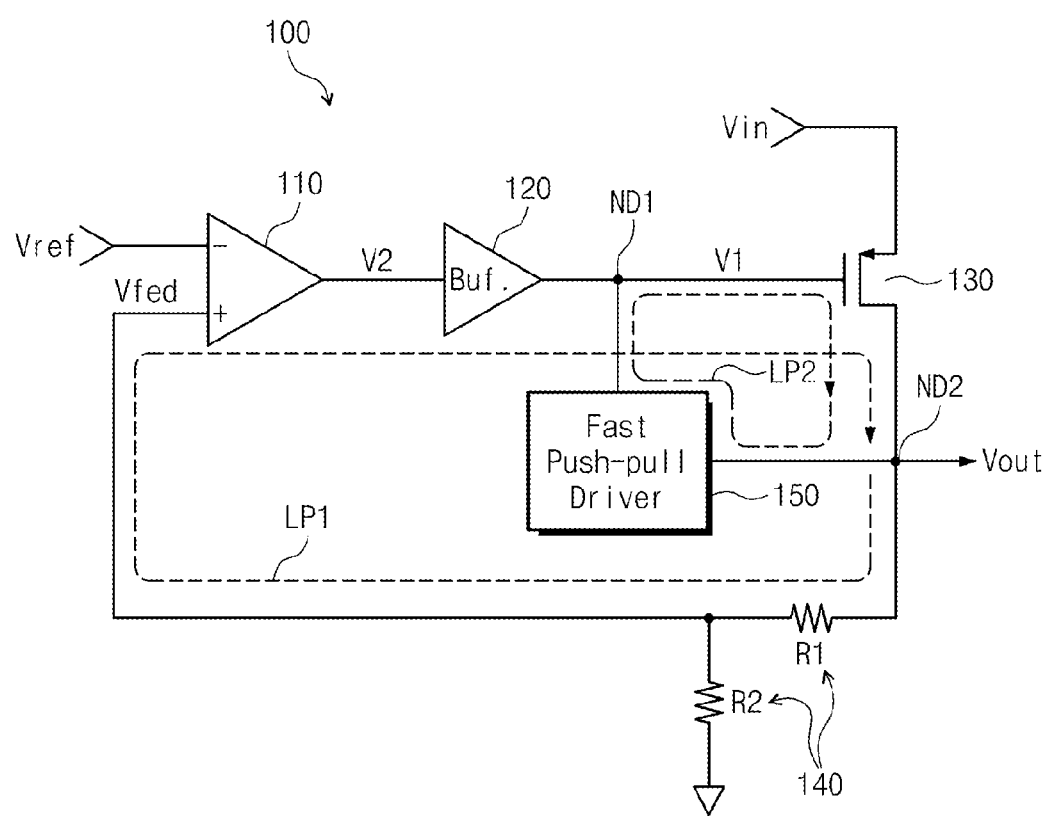
FIG. 2 is a circuit diagram schematically illustrating a voltage regulator according to an exemplary embodiment of the disclosure.

FIG. 2 is a circuit diagram schematically illustrating a voltage regulator according to an exemplary embodiment of the disclosure.

Referring to FIG. 2, a voltage regulator 100 contains an error amplifier 110, a buffer 120, a pass element 130, a voltage divider 140, and a fast push-pull driver 150.

The pass element 130 is formed of a PMOS transistor. The PMOS transistor acts as a voltage-controlled current switch and receives a power input Vin through its source and a control input V1 through its gate. A drain of the PMOS transistor is connected to an output node ND2 to receive a power output Vout. That is, the pass element 130 has the power input Vin connected with a voltage source, the power output Vout connected with a load, and the control input V1. If the power output Vout varies due to a load variation, the power output Vout of the pass element 130 is set to a target level by adjusting a voltage level of the control input V1.

The buffer 120 is connected to an input V2 and the control input V1 of the pass element 130 and performs buffering.

The error amplifier 110 forms a first feedback loop with the pass element 130 and the buffer 120. Here, the first feedback loop may mean a DC negative feedback loop. the error amplifier 110 has a positive input (+) connected to a sampled voltage Vfed of the power output Vout of the pass element 130, a negative input (−) connected to the reference voltage Vref, and the output V2 connected to an input of the buffer 120. Here, the sampled voltage Vfed may be a voltage divided by division resistors R1 and R2 of the divider 140. However, the scope and spirit of the disclosure may not be limited thereto. For example, the sampled voltage Vfed may be a voltage directly provided without voltage division using the division resistors R1 and R2 of the divider 140.

A resistance ratio of the division resistor R1 to the division resistor R2 is set to have a ratio obtained by dividing a voltage (target voltage) when the power output Vout is stabilized, by the reference voltage Vref.

The reference voltage Vref may be provided from a voltage divider using division resistors or from a band-gap reference circuit for supplying a stable reference voltage. The band-gap reference circuit may be a voltage generating circuit that is insensitive to a temperature variation.

The fast push-pull driver 150 is connected between the power output Vout of the pass element 130 and the control input V1. The fast push-pull driver 150 reduces a negative peak and a positive peak of the power output Vout due to a load variation in a speed faster than a voltage regulating speed of the first feedback loop.

In FIG. 2, the first feedback loop LP1 as a main feedback loop starts to operate from a point in time when the error amplifier 110 performs error amplification in the event that the power output Vout varies due to a load variation. The error amplification may include an operation in which the error amplifier 110 compares the positive input (+) and the negative input (−) and amplifies a comparison result. An error output of the error amplifier 110 is provided as the control input V1 after buffered through the buffer 120. If a control input V1 lower than a previously applied control input V1 is applied to the pass element 130, the PMOS transistor is turned on more strongly than previously. In this case, a voltage level of the power output Vout of the pass element 130 increases, thereby making it possible to compensate for undershoot of the target voltage. In contrast, if a control input V1 higher than the previously applied control input V1 is applied to the pass element 130, the PMOS transistor is turned on more slightly than previously. In this case, a voltage level of the power output Vout of the pass element 130 decreases, thereby making it possible to compensate for overshoot of the target voltage. As described above, the first feedback loop LP1 has a DC negative feedback operation.

Meanwhile, a second feedback loop LP2 that may be a sub-feedback loop is formed through the power output Vout, the fast push-pull driver 150, the control input V1, and the pass element 130. An operation of the fast push-pull driver 150 may enable a response speed of the second feedback loop LP2 to be faster than that of the first feedback loop LP1. When undershoot and overshoot of the power output Vout occur due to a load variation, the second feedback loop LP2 permits the power output Vout to be subjected to alternating current (AC) coupling and regulates the power output Vout with a speed faster than a regulating speed of the first feedback loop LP1. Here, the AC coupling may mean high-pass filtering for eliminating direct current (DC) and passing AC.

A function and an operation of the buffer 120 will be more fully described with reference to accompanying drawings.

According to a configuration of the voltage regulator shown in FIG. 2, undershoot or overshoot of a power output due to a load variation may be reduced or minimized within a fast time. In particular, it is possible to allow a capacitor-less electronic device to respond quickly and to provide a stable power output. Accordingly, it is possible to make the voltage regulator easily mounted on a system-on-chip and to reduce production cost and fabrication defect rate.

Figure 3:
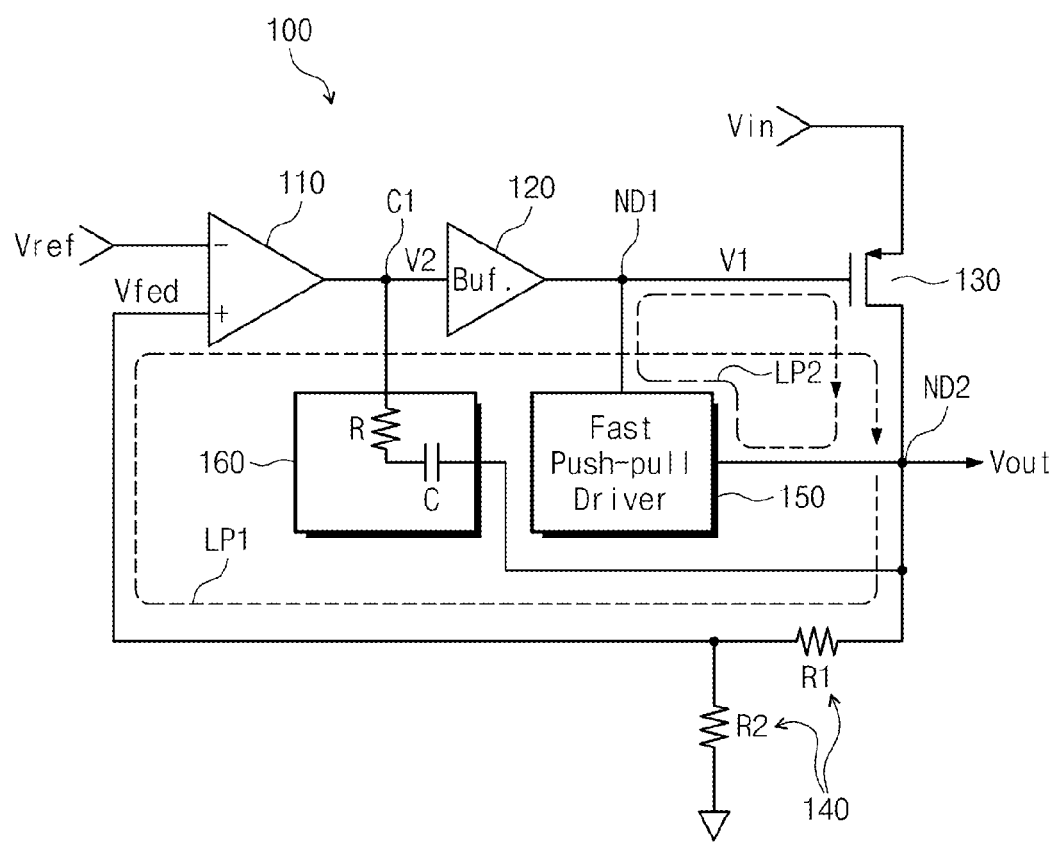
FIG. 3 is a circuit diagram schematically illustrating a voltage regulator according to another exemplary embodiment of the disclosure.

FIG. 3 is a circuit diagram schematically illustrating a voltage regulator according to another exemplary embodiment of the disclosure.

Referring to FIG. 3, a voltage regulator 100 contains an error amplifier 110, a buffer 120, a pass element 130, a voltage divider 140, a fast push-pull driver 150, and a frequency compensation filter 160.

A configuration of FIG. 3 is substantially the same as that of FIG. 2 except for the frequency compensation filter 160, which may include a series connection of a resistor R and a capacitor C, that is connected between a power output Vout of the pass element 130 and an input V2 of the buffer 120 at node C1 and compensates a frequency for frequency stabilization of the whole circuit loop. Accordingly, the voltage regulator 100 of FIG. 3 may have the same effect as a voltage regulator 100 of FIG. 2 and may further include an effect obtained by installing the frequency compensation filter 160. Frequency compensation about a first feedback loop LP1 and a second feedback loop LP2 is additionally made by installing the frequency compensation filter 160. Accordingly, frequency stabilization about the whole circuit loop may be achieved.

Below, a configuration of a fast push-pull driver will be more fully described with reference to FIG. 4.

Figure 4:
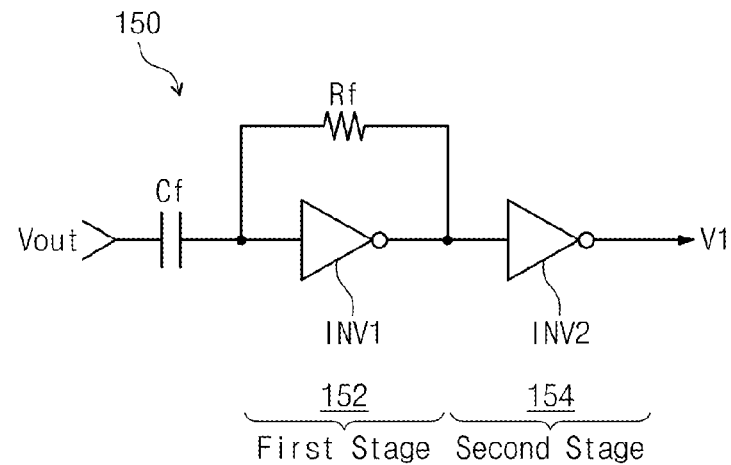
FIG. 4 is a circuit diagram schematically illustrating a fast push-pull driver shown in FIG. 2 or 3.

FIG. 4 is a circuit diagram schematically illustrating a fast push-pull driver 150 shown in FIG. 2 or 3.

Referring to FIG. 4, a fast push-pull driver 150 contains a capacitor Cf, a resistor Rf, and first and second inverters INV1 and INV2 providing amplification in a first stage 152 and a second stage 154. The fast push-pull driver 150 has an inverter type of amplification structure.

The first inverter INV1 functions as a first amplifier that generates an inverting output in response to a power output Vout of a pass element 130. The first amplifier is an inverter type of amplifier.

The second inverter INV2 functions as a second amplifier that generates a push driving current or a pull driving current for controlling a voltage level of a control input V1 at high speed in response to the inverting output. The second amplifier is an inverter type of amplifier.

The capacitor Cf and the resistor Rf function as a high-pass filter that is connected to the power output Vout to perform AC coupling. A cutoff frequency of the high-pass filter may be decided by ($\frac{1}{2\pi \times Rf \times Cf}$). The resistor Rf is connected between an input and an output of the first inverter INV1 and allows the first inverter INV1 to function as an amplifier. In FIG. 4, an illustration of the fast push-pull driver 150 having two inverters cascaded is disclosed. However, the scope and spirit of the disclosure may not be limited thereto. For example, another inverter may be additionally connected for an amplification function.

An exemplary detailed circuit of FIG. 4 may be variously implemented, which will be more fully described with reference to FIGS. 5 through 9.

Figure 5:
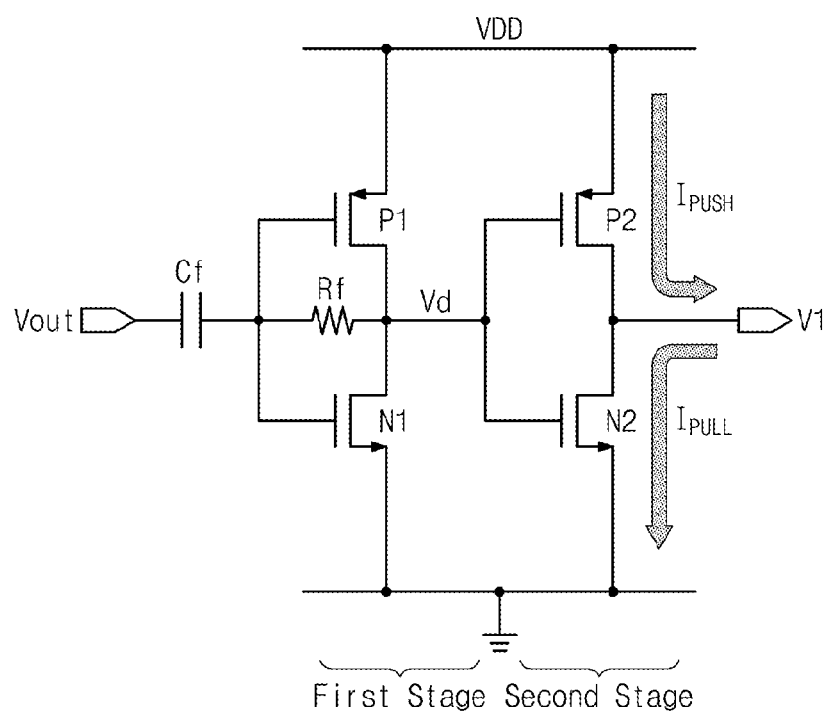
FIG. 5 is a detailed circuit diagram of an embodiment of FIG. 4.

FIG. 5 is a detailed circuit diagram of an embodiment of FIG. 4.

Referring to FIG. 5, as a first-stage amplifier, a first inverter INV1 contains a first PMOS transistor P1 having a source connected to a power supply voltage VDD, a gate connected to a power output Vout through capacitor Cf, and a drain connected to an inverting output Vd; and a first NMOS transistor N1 having a drain connected to the inverting output Vd, a gate connected to the power output Vout through capacitor Cf, and a source grounded.

A capacitor Cf and a resistor Rf sequentially connected to the power output Vout may function as a high-pass filter for AC coupling.

In a digital logic circuit, a one-stage amplifier with a very fast speed is formed when a resistor is connected between an input terminal and an output terminal of an inverter. Since not subjected to restriction of a bias current, the first inverter INV1 may increase or decrease a potential of the inverting output Vd at a fast speed. For example, in the event that a current source is connected to the source of the first PMOS transistor P1, the bias current restricts an inverting speed of the first inverter INV1. However, in the case of FIG. 5, since an inverting operation is not subjected to current restriction, in case of increasing a potential of the inverting output Vd, a potential of the inverting output Vd may increase at very fast speed.

As a second-stage amplifier, the second inverter INV2 includes a second PMOS transistor P2 having a source connected to the power supply voltage VDD, a gate connected to the inverting output Vd, and a drain connected to the control input V1; and a second NMOS transistor N2 having a drain connected to the control input V1, a gate connected to the inverting output Vd, and a source grounded.

Likewise, the second inverter INV2 may increase or decrease a potential of the control input V1 at a very fast speed with respect to a variation in the inverting output Vd without restriction of the bias current.

For the two-stage amplifier, in general, it is difficult to implement a pull function and a push function of a driving current at a second amplification stage without being subjected to restriction of the bias current. For example, in the event that it is difficult to implement the push function rather than the pull function, a current push function is restricted by bias of an error amplifier 110 or a buffer 120. The reason is that it is difficult to make a potential of the control input V1 increase quickly. In contrast, in the event that it is easy to implement the push function rather than the pull function, it is difficult to implement the pull function rather than the push function. In an embodiment of the disclosure, it is possible to permit a push current or a pull current not to be restricted by any other bias current with respect to a potential variation.

For a structure shown in FIG. 5, because a considerable amount of bias current flows when a supply voltage is high, current limiting elements may be additionally installed, as illustrated in FIGS. 6 to 9, to restrict a bias current and to compensate for mismatching of a bias current of the second inverter INV2 due to a voltage level of the control input V1.

Figure 7:
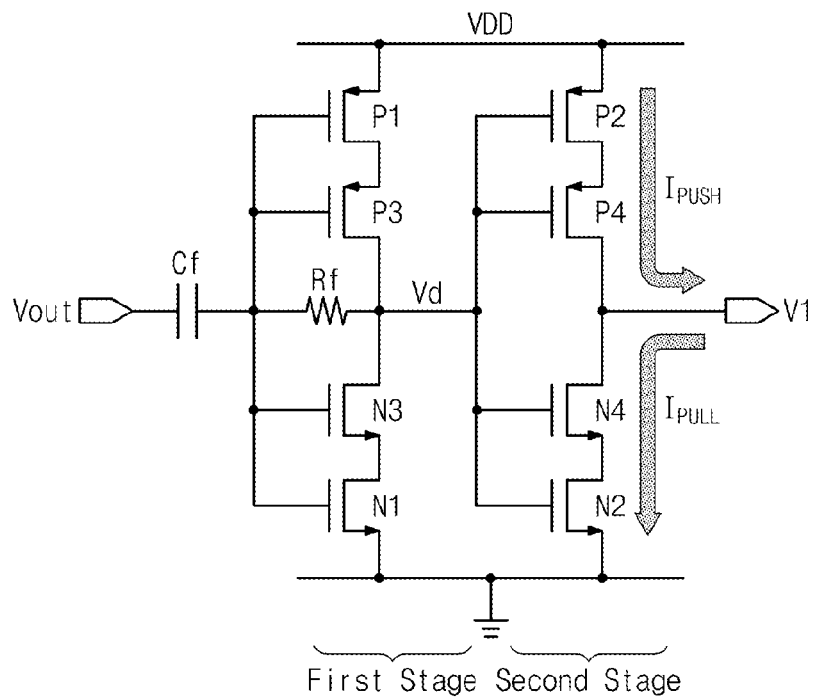
FIG. 7 is a detailed circuit diagram illustrating still another embodiment of FIG. 4.

For example, in FIG. 7, MOS transistors N3, N4, P3, and P4 may be installed as current limiting elements to perform the above-described function.

Figure 6:
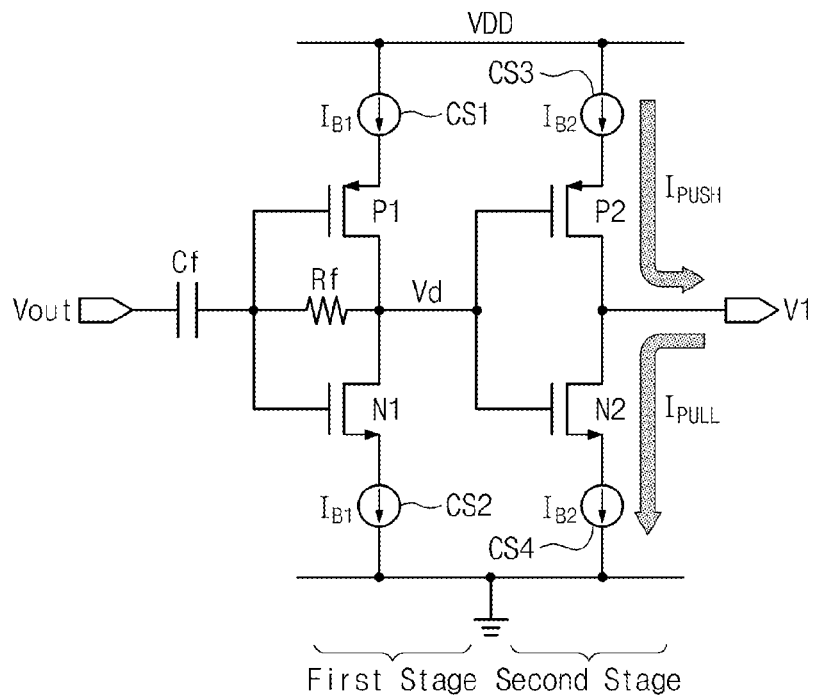
FIG. 6 is a detailed circuit diagram illustrating another embodiment of FIG. 4.

FIG. 6 is a detailed circuit diagram illustrating another embodiment of FIG. 4.

Referring to FIG. 6, as a first-stage amplifier, a first inverter INV1 contains a first current source CS1 connected to a power supply voltage VDD; a first PMOS transistor P1 having a source connected to an output of the current source CS1, a gate connected to a power output Vout through capacitor Cf, and a drain connected to an inverting output Vd; a first NMOS transistor N1 having a drain connected to the inverting output Vd and a gate connected to the power output Vout through capacitor Cf; and a second current source CS2 connected between a source of the first NMOS transistor N1 and a ground voltage.

As a second-stage amplifier, a second inverter INV2 contains a third current source CS3 connected to the power supply voltage VDD; a second PMOS transistor P2 having a source connected to an output of the current source CS2, a gate connected to the inverting output Vd, and a drain connected to a control input V1; a second NMOS transistor N2 having a drain connected to the control input V1 and a gate connected to the inverting output Vd; and a fourth current source CS4 connected between a source of the second NMOS transistor N2 and the ground voltage.

Current sources CS1 and CS2 may provide a current of $I_{B1}$. Current sources CS3 and CS4 may provide a current of IB2.

Similarly, a capacitor Cf and a resistor Rf sequentially connected to the power output Vout may function as a high-pass filter for AC coupling.

For FIG. 6, the first to fourth current sources CS1 to CS4 are installed as current limiting elements to perform the above-described function.

FIG. 7 is a detailed circuit diagram illustrating still another embodiment of FIG. 4.

Referring to FIG. 7, as a first-stage amplifier, a first inverter INV1 contains a first PMOS transistor P1 having a source connected to a power supply voltage VDD and a gate connected to a power output Vout through capacitor Cf; a third PMOS transistor P3 having a source connected to a drain of the first PMOS transistor P1, a gate connected to the power output Vout through capacitor Cf, and a drain connected to an inverting output Vd; a first NMOS transistor N1 having a gate connected to the power output Vout through capacitor Cf and a source connected to a ground voltage; and a third NMOS transistor N3 having a drain connected to the inverting output Vd, a gate connected to the power output Vout through capacitor Cf, and a source connected to a drain of the first NMOS transistor N1.

As a second-stage amplifier, a second inverter INV2 contains a second PMOS transistor P2 having a source connected to the power supply voltage VDD and a gate connected to the inverting output Vd; a fourth PMOS transistor P4 having a source connected to a drain of the second PMOS transistor P2, a gate connected to the inverting output Vd, and a drain connected to a control input V1; a second NMOS transistor N2 having a gate connected to the inverting output Vd and a source connected to the ground voltage; and a fourth NMOS transistor N4 having a drain connected to the control input V1, a gate connected to the inverting output Vd, and a source connected to a drain of the second NMOS transistor N2.

Similarly, a capacitor Of and a resistor Rf sequentially connected to the power output Vout may function as a high-pass filter for AC coupling.

For a structure shown in FIG. 7, no leakage current flows at a standby state, and a push current or a pull current is generated at a circuit active state. Accordingly, a circuit shown in FIG. 7 may be used as a component for providing stable power to a product such as a memory card.

Figure 8:
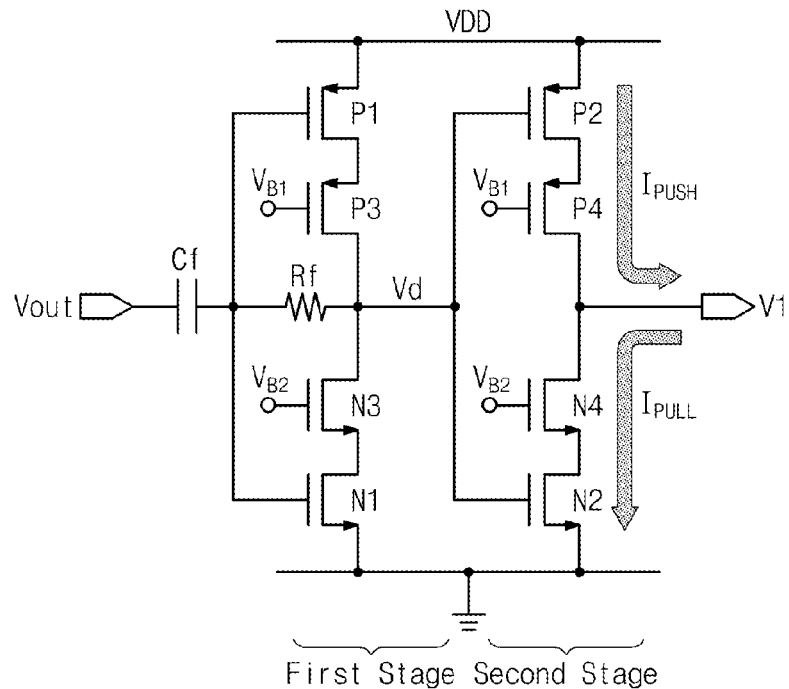
FIG. 8 is a detailed circuit diagram illustrating a further embodiment of FIG. 4.

FIG. 8 is a detailed circuit diagram illustrating a further embodiment of FIG. 4.

Referring to FIG. 8, as a first-stage amplifier, a first inverter INV1 contains a first PMOS transistor P1 having a source connected to a power supply voltage VDD and a gate connected to a power output Vout through capacitor Cf; a third PMOS transistor P3 having a source connected to a drain of the first PMOS transistor P1, a gate connected to a first control voltage $V_{B1}$, and a drain connected to an inverting output Vd; a first NMOS transistor N1 having a gate connected to the power output Vout through capacitor Cf and a source connected to a ground voltage; and a third NMOS transistor N3 having a drain connected to the inverting output Vd, a gate connected to a second control voltage $V_{B2}$, and a source connected to a drain of the first NMOS transistor N1.

As a second-stage amplifier, a second inverter INV2 contains a second PMOS transistor P2 having a source connected to the power supply voltage VDD and a gate connected to the inverting output Vd; a fourth PMOS transistor P4 having a source connected to a drain of the second PMOS transistor P2, a gate connected to the first control voltage $V_{B1}$, and a drain connected to a control input V1; a second NMOS transistor N2 having a gate connected to the inverting output Vd and a source connected to the ground voltage; and a fourth NMOS transistor N4 having a drain connected to the control input V1, a gate connected to the second control voltage $V_{B2}$, and a source connected to a drain of the second NMOS transistor N2.

Similarly, a capacitor Cf and a resistor Rf sequentially connected to the power output Vout may function as a high-pass filter for AC coupling.

For FIG. 8, the MOS transistors N3, N4, P3, and P4 are installed as current limiting elements to perform the above-described function.

Figure 9:
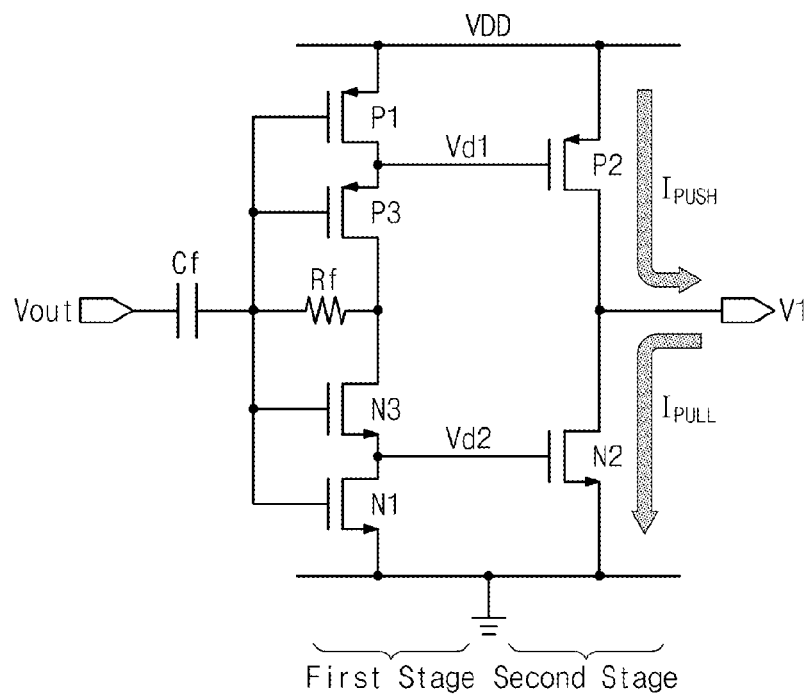
FIG. 9 is a detailed circuit diagram illustrating still another embodiment of FIG. 4.

FIG. 9 is a detailed circuit diagram illustrating still another embodiment of FIG. 4.

Referring to FIG. 9, as a first-stage amplifier, a first inverter INV1 contains a first PMOS transistor P1 having a source connected to a power supply voltage VDD and a gate connected to a power output Vout through capacitor Cf; a third PMOS transistor P3 having a source connected to a drain of the first PMOS transistor P1 and a gate connected to the power output Vout through capacitor Cf; a first NMOS transistor N1 having a gate connected to the power output Vout through capacitor Cf and a source connected to a ground voltage; and a third NMOS transistor N3 having a drain connected to a drain of the third PMOS transistor P3, a gate connected to the power output Vout through capacitor Cf, and a source connected to a drain of the first NMOS transistor N1.

As a second-stage amplifier, a second inverter INV2 contains a second PMOS transistor P2 having a source connected to the power supply voltage VDD, a gate connected to the drain of the first PMOS transistor P1, and a drain connected to a control input V1; and a second NMOS transistor N2 having a drain connected to the control input V1, a gate connected to the drain of the first NMOS transistor N1, and a source grounded.

Similarly, a capacitor Of and a resistor Rf sequentially connected to the power output Vout may function as a high-pass filter for AC coupling.

For FIG. 9, the MOS transistors N3 and P3 are installed as current limiting elements to perform the above-described function. Also, a bipolar transistor or a resistor may be installed as the current limiting elements A cutoff frequency of a high-pass filter may be set to be lower than a voltage ripple frequency. Accordingly, a voltage ripple on the power output Vout may act as a component for adjusting a potential of the control input V1 quickly after passing through a capacitor in the high-pass filter and being subject to two-stage inverting by two inverters.

Figure 10:
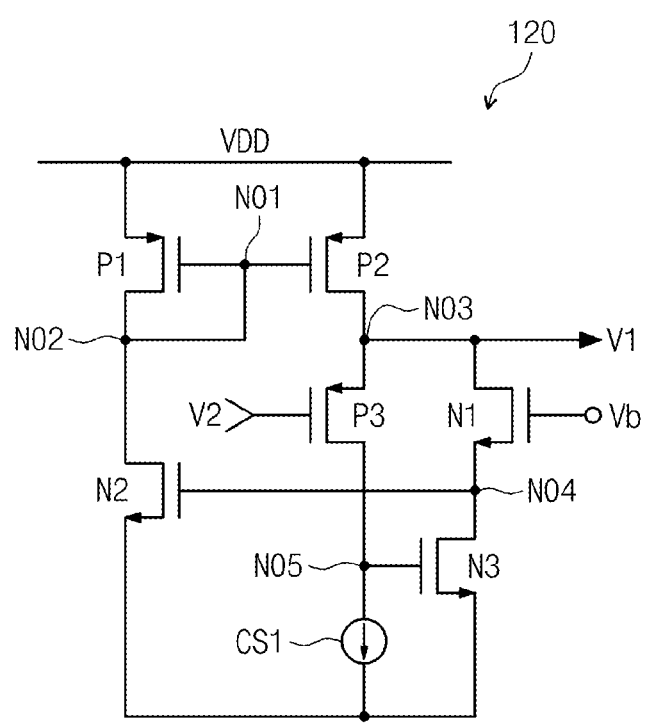
FIG. 10 is a detailed circuit diagram illustrating an embodiment of a buffer of FIG. 2 or 3.

FIG. 10 is a detailed circuit diagram illustrating an embodiment of a buffer of FIG. 2 or 3.

Referring to FIG. 10, a buffer 120 contains first and second transistors P1 and P2 each having a source connected to a power supply voltage VDD and a gate connected to a first node NO1; a third PMOS transistor P3 having a source connected to a drain of the second PMOS transistor P2 and a gate receiving an input voltage V2; a first NMOS transistor N1 having a drain connected to an output voltage V1 and a gate receiving a bias voltage Vb; a second NMOS transistor N2 having a drain connected to a drain of the first PMOS transistor P1 at node NO2 and a gate connected to a fourth node NO4; a third NMOS transistor N3 having a drain connected to the fourth node NO4 and a gate connected to a drain of the third PMOS transistor P3; and a current source CS1 connected between a fifth node NO5 and a ground voltage.

In FIG. 10, an output V2 of an error amplifier 110 is applied to the gate of the PMOS transistor P3, and a third node NO3 is connected with the source of the PMOS transistor P3 and a control input node ND1 of FIG. 2 or 3.

In FIG. 10, the buffer 120 is of a super source follower structure having a push-pull function. This structure makes impedance of the third node NO3 smaller, thereby making it possible to shift a pole position of the control input node ND1 into a higher frequency. Accordingly, a bandwidth of a first feedback loop LP1 being a main feedback loop is also widened as a pole position of the control input node ND1 is shifted into a higher frequency. Moreover, even though bias current mismatch occurs at a second amplification stage 154 of a fast push-pull driver, the buffer 120 buffers the mismatch to some extent, thereby minimizing or preventing a variation in an operating point.

Accordingly, even though a load current is sharply varied, the buffer 120 shown in FIG. 10 allows a voltage regulator to regulate a voltage at a fast response speed without limiting a slew.

Figure 11A:
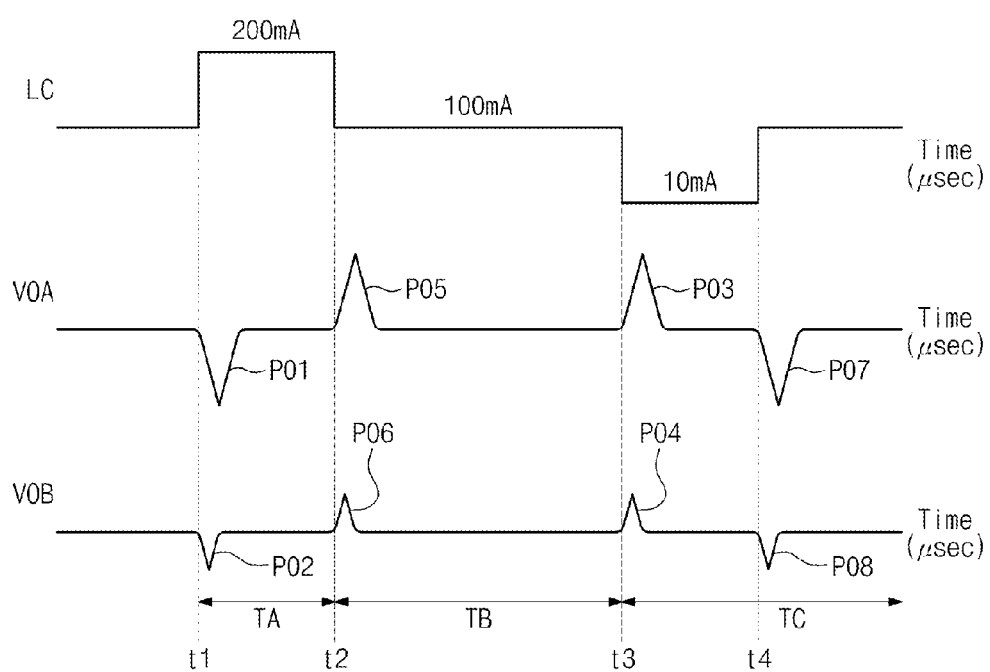
FIG. 11A is a waveform diagram for describing a voltage regulating operation according to FIG. 2 or 3.

FIG. 11A is a waveform diagram for describing a voltage regulating operation according to FIG. 2 or 3.

In FIG. 11A, the abscissa represents a time, and the ordinate represents amplitude of power. A waveform LC is a waveform illustrating a variation in a load current. The power consumed by an electronic device may increase or decrease according to a used load of the electronic device. For example, it is assumed that 100 mA is consumed in a time period TB. If a load increases as compared with a time period TB, 200 mA is consumed in a time period TA. If a load increases as compared with a time period TB, 10 mA is consumed in a time period TC.

In the above-described case, as described with reference to FIG. 2 or 3, a power output Vout having a waveform VOA is generated by a voltage regulating operation of a single first feedback loop LP1. Voltage regulating is stabilized more quickly through a second feedback loop LP2 formed by a fast push-pull driver 150. Accordingly, a power output Vout having a waveform VOB is generated.

In FIG. 11A, magnitude of a negative peak PO2 of the waveform VOB is smaller than that of a negative peak PO1 of the waveform VOA, and magnitude of a positive peak PO4 of the waveform VOB is smaller than that of a positive peak PO3 of the waveform VOA. Accordingly, overshoot or undershoot of an output voltage due to a load variation may be regulated by generating a push current or a pull current of the fast push-pull driver 150 more quickly than by a single first feedback loop. A positive peak of the overshoot is stabilized in a fast time by a supply of a push current quickly provided at an inverter-type amplification structure, and a negative peak of the undershoot is stabilized in a fast time by a supply of a pull current quickly provided at the inverter-type amplification structure. This means that fast overshoot and undershoot regulating is possible.

Figure 11B:
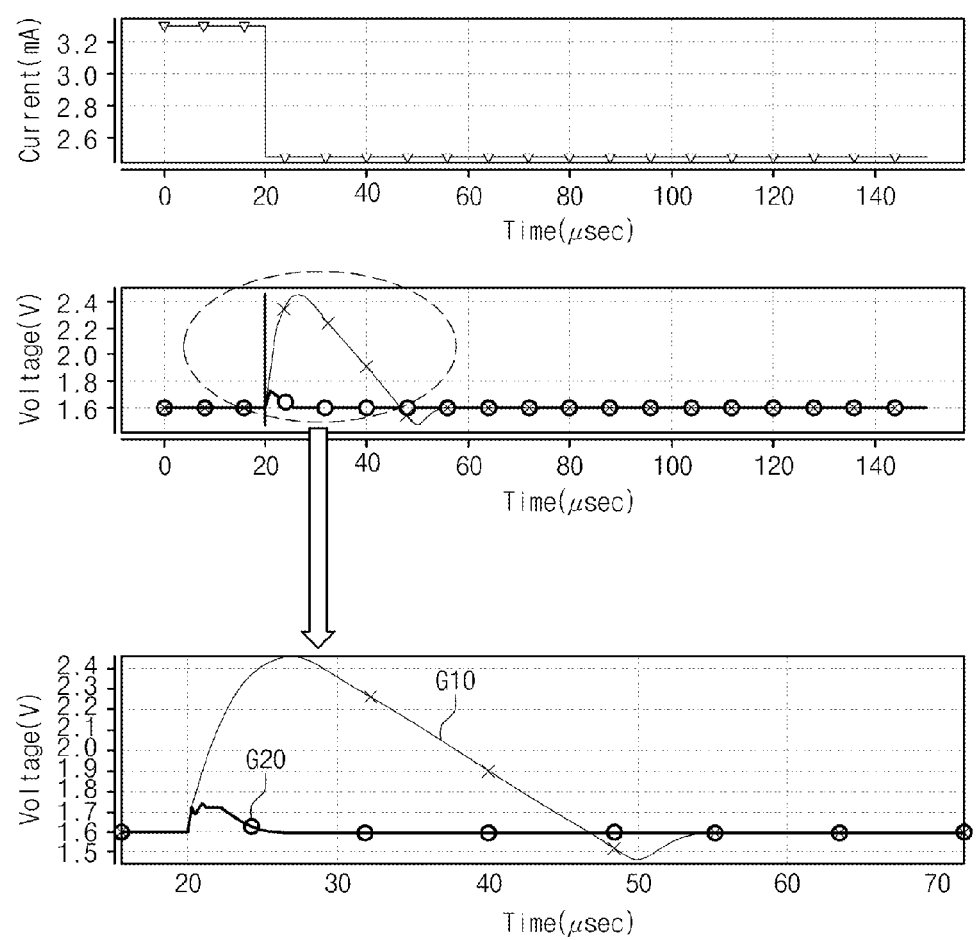
FIG. 11B is a waveform diagram for describing a positive peak decreasing operation according to FIG. 2 or 3.

FIG. 11B is a waveform diagram for describing a positive peak decreasing operation according to FIG. 2 or 3.

In FIG. 11B, the abscissa represents a time, and the ordinate represents amplitude of power. A graph waveform G10 illustrates overshoot of a power output Vout when a first feedback loop LP1 solely operates. Meanwhile, a graph waveform G20 illustrates overshoot of the power output Vout reduced when an operation of a second feedback loop LP2 participates in an operation of the first feedback loop LP1. A push current is quickly supplied to a control input V1 through an AC negative feedback operation by using the second feedback loop LP2 together with the first feedback loop LP1. Accordingly, a level of a control input V1 is set to be higher such that the overshoot of the power output Vout is quickly regulated.

Figure 12:
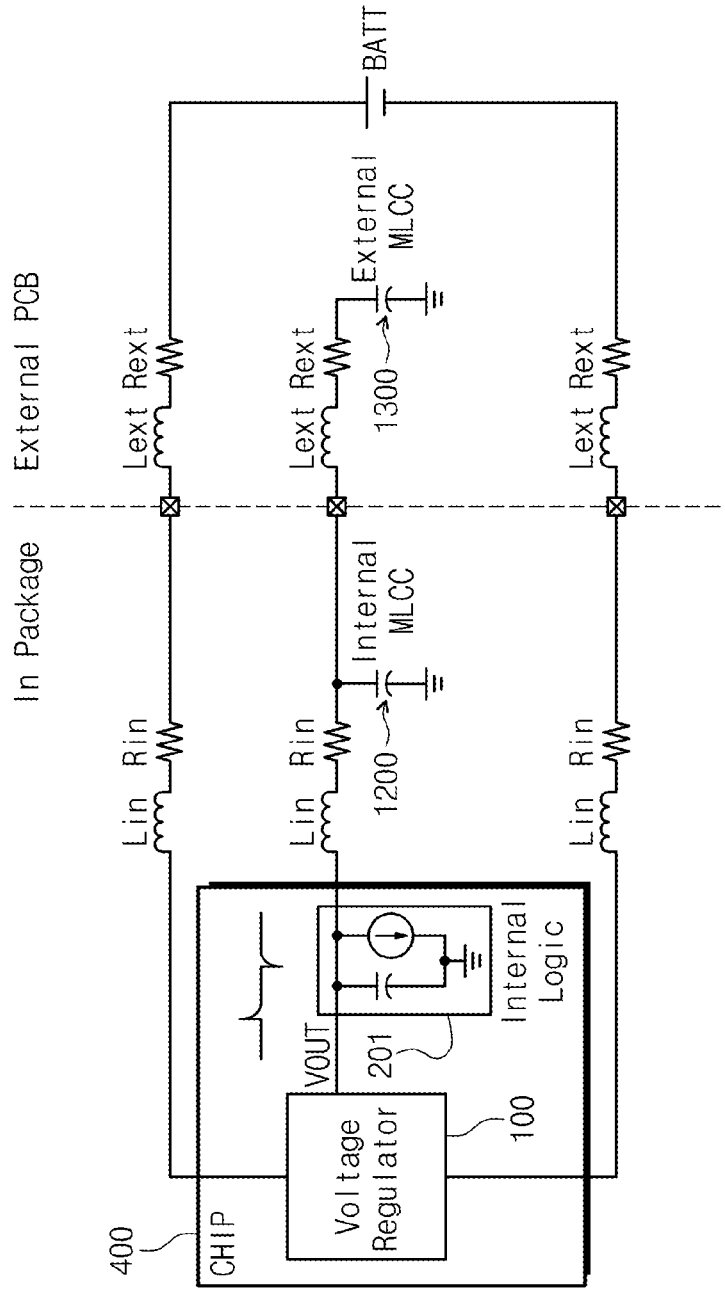
FIG. 12 is a diagram schematically illustrating a connection structure of a low drop-out voltage regulator equipped with a capacitor.
Figure 13:
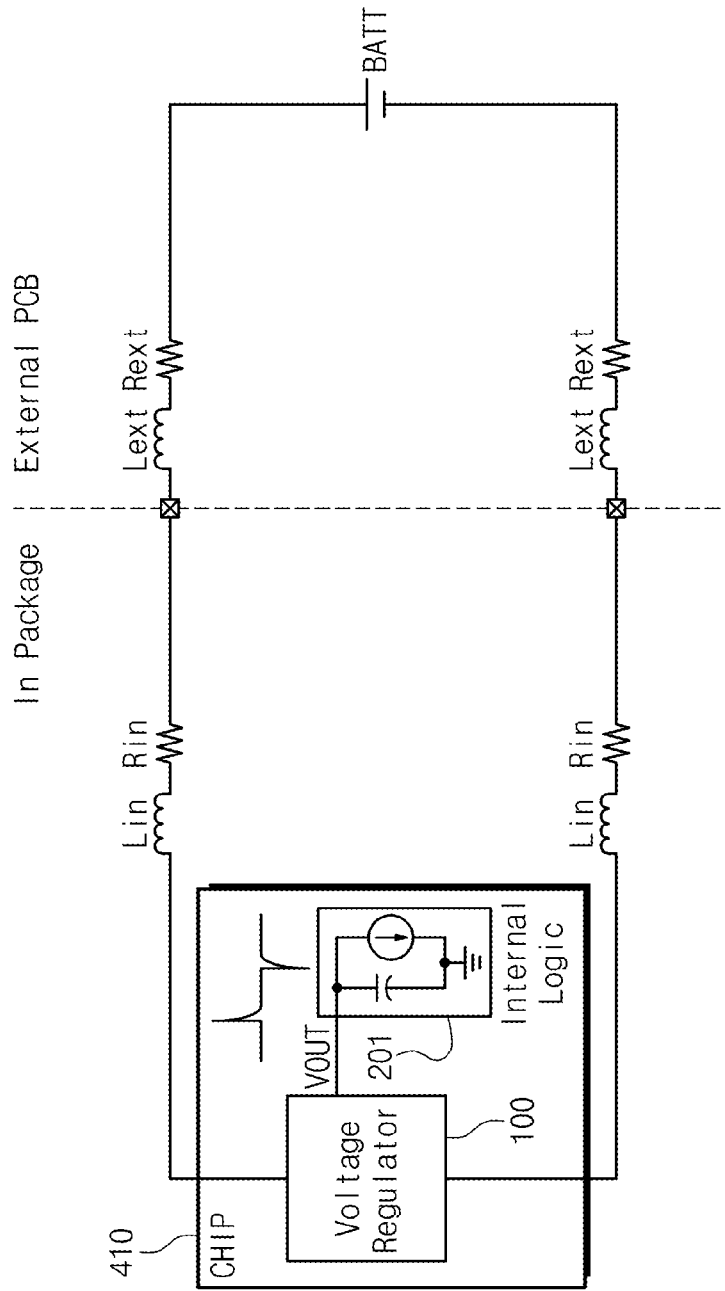
FIG. 13 is a diagram schematically illustrating a connection structure of a capacitor-less type of low drop-out voltage regulator.

As described above, a voltage regulator having the fast push-pull driver 150 is easy to be installed at a high-end system on chip shown in FIG. 12 or 13.

Returning to FIG. 2, an operation of a voltage regulator having the fast push-pull driver 150 shown in FIG. 5 will be more fully described.

An operation of the voltage regulator will be described under the following situation. As a load current decreases suddenly, as illustrated at a point in time t3 of FIG. 11A, a positive peak included in overshoot may be generated at a power output node ND2.

First, an operation of a second feedback loop LP2 being a sub-feedback loop commences before a start of a voltage regulating operation of a first feedback loop LP1 being a main feedback loop. That is, an operation of a fast push-pull driver 150 connected between an output node ND1 of a buffer 120 and a power output node ND2 first commences as an operation of an AC negative feedback loop.

A first amplification stage 152 of FIG. 4 performs high-pass filtering and inverting about a positive peak PO3. That is, the positive peak generated at the power output node ND2 is AC coupled by a capacitor Cf of FIG. 5 and is inverted through a first inverter amplifier formed of a PMOS transistor P1, an NMOS transistor N1, and a resistor Rf. Accordingly, a potential of an inverting output Vd is reduced at a very fast speed through a fast inverting operation of the first inverter amplifier.

In this case, a PMOS transistor P2 of a second inverter amplifier supplies a push current to a control input V1 in response to the inverting output Vd. That is, since a low potential is applied to a gate of the PMOS transistor P2, a driving current increases; since a low potential is applied to a gate of an the NMOS transistor N2, a driving current decreases.

Thus, a second inverter INV2 may increase a potential of the control input V1 at a very fast speed with respect to a variation in the inverting output Vd without restriction of a bias current.

Accordingly, a pass element 130 reduces the amount of passing current of a power input in response to a potential of the control input V1 thus increased. In other words, a positive peak of the power output Vout starts to be stabilized within a fast time.

During the above-described operation, a voltage regulating operation of a first feedback loop LP1 commences when a feedback voltage Vfed obtained by dividing the positive peak through a voltage divider 140 is applied to the error amplifier 110.

The error amplifier 110 compares a voltage of a positive input (+) and a voltage of a negative input (−) to amplify a comparison result. An error output V2 of the error amplifier 110 is provided as the control input V1 after buffered through a buffer 120.

Here, the buffer 120 works together with the fast push-pull driver 150, thereby permitting an operating speed of a voltage regulator of FIG. 2 to become faster and the voltage regulator to have a stable response speed. That is, the second feedback loop LP2 operates for a little while when a sudden change occurs at the power output Vout. For this reason, in consideration of the whole operation, an operation of the first feedback loop LP1 has to be sufficiently fast. The reason is that a voltage of the power output Vout is quickly regulated when an operation of the second feedback loop LP2 becomes weak. As described above, if the buffer 120 is installed at the first feedback loop LP1 being a main feedback loop, a fast response speed may be secured without restricting a slew even at a sudden change in a load current.

Eventually, since a potential of the control input V1 generated by the first feedback loop LP1 increases when the positive peak occurs, the pass element 130 reduces the amount of passing current of the power input in response to a potential of the control input V1 thus increased. Thus, the positive peak of the power output Vout is reduced within a fast time such that overshoot of an output voltage is eliminated.

As described above, a positive peak of a power output may be reduced at a faster speed than a voltage regulating speed of a single first feedback loop, as illustrated by a pulse PO4 of 11A or a graph G20 of FIG. 11B, through a 2-stage inverting operation of the fast push-pull driver 150 connected between the power output Vout of the pass element 130 and the control input V1 in an inverter-type amplification structure.

Eventually, an operating capacity of the second feedback loop LP2 is weak if a sudden change in the power output Vout decreases, and a following operation of the first feedback loop LP1 having a relatively great loop gain stabilizes the whole voltage regulator.

Meanwhile, a negative peak is AC coupled by a capacitor Cf of FIG. 5. The AC coupled negative peak is inverted by a first inverter amplifier formed of a PMOS transistor P1, an NMOS transistor N1, and a resistor Rf. Accordingly, a potential of an inverting output Vd may be increased at a very fast speed through fast inverting and amplification operations of the first inverter amplifier.

In this case, the NMOS transistor N2 of the second inverter INV2 quickly pulls down a potential of the control input V1 toward a ground voltage in response to the inverting output Vd. Accordingly, the second inverter INV2 decreases a potential of the control input V1 at a very fast speed with respect to a variation in the inverting output Vd without restricting a bias current.

According to the above description, the pass element 130 increases the amount of passing current of a power input in response to a potential of the control input quickly lowered. In other words, a negative peak of the power output Vout starts to be stabilized within a fast time.

During the above-described operation, a voltage regulating operation of the first feedback loop LP1 commences when the feedback voltage Vfed obtained by dividing the negative peak through the voltage divider 140 is applied to the error amplifier 110.

The error amplifier 110 compares a voltage of the positive input (+) and a voltage of the negative input (−) to amplify a comparison result. The error output V2 of the error amplifier 110 is provided as the control input V1 after buffered through the buffer 120.

Since a potential of the control input V1 generated by the first feedback loop LP1 decreases according to generation of the negative peak, the pass element 130 increases the amount of passing current of the power input in response to a potential of the control input V1 thus lowered. Accordingly, the negative peak of the power output Vout is made up for within a fast time, so undershoot of the output voltage is eliminated.

As described above, a negative peak of the power output may be reduced at a faster speed than a voltage regulating speed of a single first feedback loop, as illustrated by a pulse PO2 of 11A, through a 2-stage inverting operation of the fast push-pull driver 150 connected between the power output Vout of the pass element 130 and the control input V1 in an inverter-type amplification structure.

The voltage regulator according to an exemplary embodiment of the disclosure has a characteristic of responding to a load change at a fast speed through a 2-stage inverting operation of the fast push-pull driver 150 connected in an inverter-type amplification structure. This characteristic is necessary for a high-end system on chip in which the considerable amount of load current is consumed and a change speed is fast. In particular, such an operating speed may be very useful when a chip is not equipped with a capacitor such as a Multilayer Ceramic Capacitor (MLCC).

In the event that the voltage regulator having the fast push-pull driver 150 connected in an inverter-type amplification structure is applied to a capacitor-less type structure, the fully on-chip structure is possible without additional PCB interconnections or pins (balls). Also, the voltage regulator is very advantageous in terms of production cost, SoC design, and yield according to a decrease in a defect rate. Accordingly, it is possible to secure competitiveness of product in the SoC market.

Voltage regulating according to the disclosure may include the following steps.

First step: forming a DC feedback loop by connecting an error amplifier and a buffer sequentially between a power output and a control input of a path transistor.

Second step: forming an AC feedback loop by connecting a fast push-pull driver between the power output and the control input of the path transistor.

Third step: controlling the DC feedback loop to drive the power output with a level of a target voltage.

Fourth step: discharging a pull current from the control input by controlling the AC feedback loop at a speed faster than a regulating speed of the DC feedback loop, when undershoot occurs at the target voltage level.

Fifth step: supplying a push current to the control input by controlling the AC feedback loop at a speed faster than a regulating speed of the DC feedback loop, when overshoot occurs at the target voltage level.

Here, the steps are interchangeable and are not limited as having a temporal sequence.

In the voltage regulator including a pass element, a buffer, and an error amplifier, a fast push-pull driver of a 2-stage inverter amplification structure for reducing positive and negative peaks of a power output at a fast speed, as compared with a main feedback loop, is installed between the power output and a control input of the pass element, thereby minimizing or eliminating a voltage ripple due to a load change at high speed.

FIG. 12 is a diagram schematically illustrating a connection structure of a low drop-out voltage regulator equipped with a capacitor.

Referring to FIG. 12, in a system on chip, a chip 400 includes internal logic 201, as an electronic device, such as an application processor (AP) or a memory controller. A voltage regulator 100 according to an exemplary embodiment of the disclosure is integrated on the chip 400. In this case, capacitors 1200 and 1300 for voltage stabilization are mounted outside or inside of a package. Each of the capacitors 1200 and 1300 may be a Multi-Layer Ceramic Capacitor (MLCC) having a considerably great capacitance of about several μF. The internal capacitor 1200 may be a capacitor that will be installed closer to the chip in the event that a load current is great and is suddenly varied. An inductor Lin and a resistance Rin may internal parasitic components. Meanwhile, an inductor Lext and a resistance Rext may external parasitic components.

In FIG. 12, the capacitor may cause an increase in production cost and an increase in fabrication defect rate. That is, PCB interconnections or circuit elements are additionally required to install the MLCCs outside or inside of the package, thereby causing an increase in production cost. Moreover, installing of the MLCCs outside or inside of the package may cause a thickness increase of the package and an increase in a defect rate at soldering. Therefore, in the system on chip, a demand for fully integrated cap-less low drop-out (LDO) may increase. Since having effects according to a configuration shown in FIG. 2 or 3, a voltage regulator according to the disclosure may be more easily applied to a cap-less structure shown in FIG. 13.

FIG. 13 is a diagram schematically illustrating a connection structure of a capacitor-less type of low drop-out voltage regulator.

Referring to FIG. 13, in a system on chip, a chip 410 includes internal logic 201. A voltage regulator 100 according to an exemplary embodiment of the disclosure is integrated on the chip 410. In FIG. 13, capacitors are not mounted outside or inside of a package. Eventually, since there is obtained an effect according to a configuration shown in FIG. 2 or 3, it is possible to provide a capacitor-less type of SoC that does not include a Multi-Layer Ceramic Capacitor (MLCC).

As the performance of SoC is improved, the number of logic counts therein and a clock frequency sharply increase. Accordingly, the amount of load current to be supplied by the voltage regulator and a transient variation also increase. In this case, if a conventional voltage regulator supplies power without the aid of MLCCs, it may not follow a fast change in a load current, thereby causing great ripple at a power output. A timing characteristic of a digital circuit operating at a frequency varies when great ripple is generated at the power output, thereby causing an abnormal operation of the whole system. Since a wideband voltage regulator according to an exemplary embodiment of the disclosure has a very fast regulating speed, it is possible to satisfy the performance or condition of a voltage regulator without MLCCs.

As for FIG. 2 or 3, a voltage regulator having a fast push-pull driver 150 of an inverter type amplification structure may minimize or reduce undershoot or overshoot due to a load variation within a fast time. In particular, since the voltage regulator responds quickly and provides a stable power output even at a capacitor-less type electronic device, it is possible to mount it on a system on chip and to reduce production cost and a fabrication defect rate.

Figure 14:
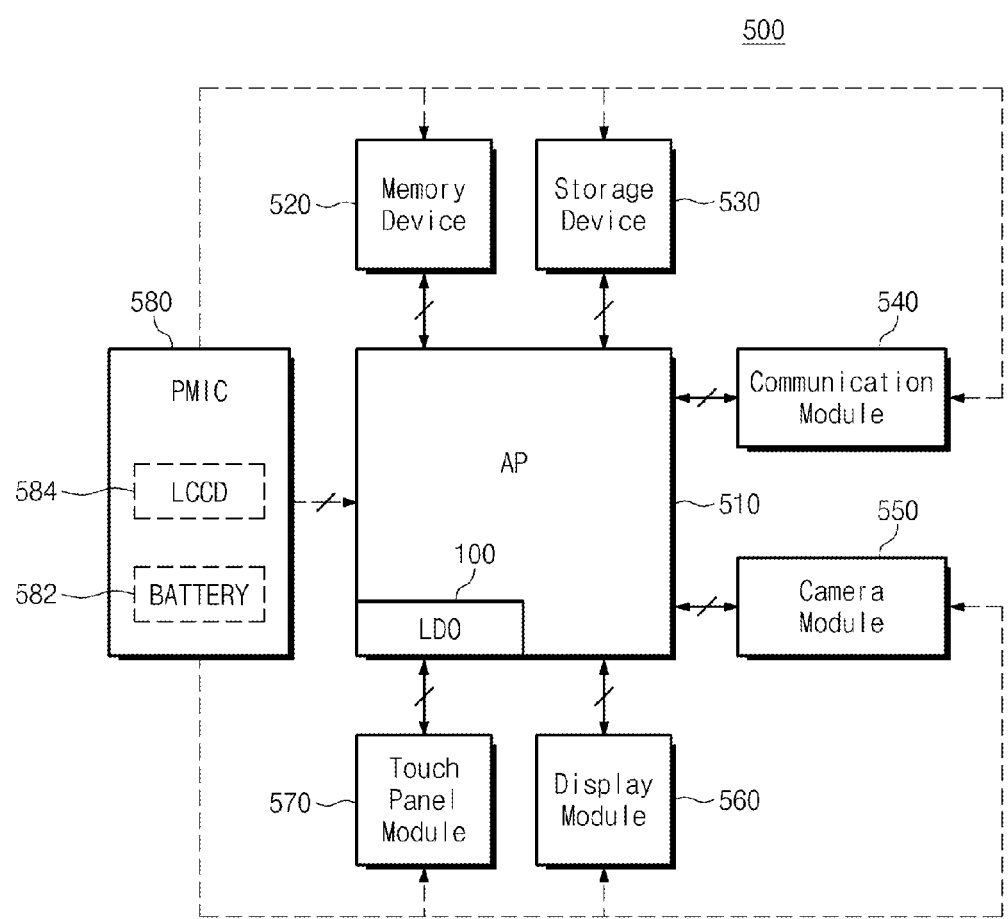
FIG. 14 is a block diagram schematically illustrating an application including a system on chip, according to an exemplary embodiment of the disclosure.

FIG. 14 is a block diagram schematically illustrating an application including a system on chip, according to an exemplary embodiment of the disclosure.

Referring to FIG. 14, a multimedia device 500 formed of a system on chip contains an application processor (AP) 510, a memory device 520, a storage device 530, a communication module 540, a camera module 550, a display module 560, a touch panel module 570, and a power management IC 580.

The AP 510 processes data. The memory device 520 may be formed of a volatile memory such as DRAM. The volatile memory may store data processed by the AP 510 or may act as a working memory. For example, the volatile memory may be implemented with a DRAM, an SRAM, a mobile DRAM, and a memory similar therewith.

The communication module 540 connected with the AP 510 may include a modem for transmitting and receiving communication data and modulating and demodulating data. The communication module 540 may include a transceiver for short range wireless communication, for example, an NFC (Near Field Communication) transceiver. For a communication manner such as GSM (Global System for Mobile communications) or CDMA (Code Division Multiple Access), an NFC transceiver may be implemented that is defined in the NFC interface having protocols NFCIP-1 and NFCIP-2 that are compliant with the regulation standardized by ECMA-340, ISO/IEC 18092, ETSI TS 102 190, ISO 21481, EC MA 352, ETSI TS 102 312.

The storage device 530 may be implemented with a NOR or NAND flash memory to store mass information. The storage device 530 may be implemented with a nonvolatile memory and may store a booting code for booting a system. For example, the nonvolatile memory may be formed of EEPROM (Electrically Erasable Programmable Read-Only Memory), flash memory, PRAM (Phase change RAM), RRAM or ReRAM (Resistive RAM), NFGM (Nano Floating Gate Memory), PoRAM (Polymer RAM), MRAM (Magnetic RAM), STT-MRAM (Spin-Transfer Torque MRAM), FeRAM (Ferroelectric RAM), holographic memory, molecular electronics memory, or insulator resistance change memory, or a memory similar therewith. The display module 560 may be implemented with liquid crystal having a backlight or an LED light source or OLED. The display module 560 may function as an output device for displaying a character, a number, and an image such as a picture in color.

The touch panel module 570 solely provides a touch input to the AP 510 or provides the touch input to the AP 510 on the display module 560.

The multimedia device may be connected with an external communication device through a separate interface. The external communication device may include the following: a DVD player, a computer, a set top box (STB), a game machine, and a digital camcorder.

The power management IC 580 includes an LCCD 584 and a battery 582 and manages the power of the multimedia device.

The AP 510 includes an LDO voltage regulator 100 having a fast push-pull driver 150 shown in FIG. 2 or 3. Accordingly, it is possible to minimize or reduce undershoot or overshoot of a power output due to a load change of a system on chip within a fast time when the AP 510 operates. In particular, since the voltage regulator responds quickly and provides a stable power output even at a capacitor-less type multimedia device, it is possible to mount it on a system on chip and to reduce production cost and a fabrication defect rate.

The power management IC 580 may include a switch mode power supply (SMPS).

A response speed of the LDO voltage regulator 100 of the AP 510 may be faster than that of the SMPS, and noise of the LDO voltage regulator 100 may be smaller than that of the SMPS.

The camera module 550 includes a Camera Image Processor (CIS) and is connected with the AP 510.

Although not shown in FIG. 14, the multimedia device may further include the following: an application chipset and a mobile DRAM.

Figure 15:
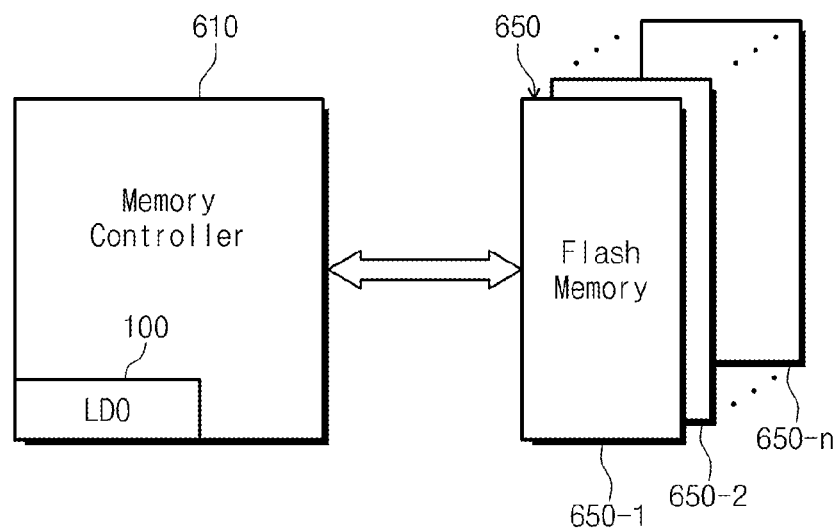
FIG. 15 is a block diagram schematically illustrating an application mounted on a solid state drive, according to an exemplary embodiment of the disclosure.

FIG. 15 is a block diagram schematically illustrating an application mounted on a solid state drive (SSD), according to an exemplary embodiment of the disclosure.

Referring to FIG. 15, a solid state drive (SSD) contains a memory controller 610 and a flash memory 650. The flash memory 650 may include a plurality of memories 650-1 to 650-n formed in a planar type or a three-dimensional stack type. According to an exemplary embodiment of the disclosure, a low drop-out voltage regulator 100 having a fast push-pull driver 150 of an inverter type amplification structure is installed at the memory controller 610 and supplies a power output to the memory controller 610 quickly and stably. Even though ripple occurs at a power output due to a sudden load change, the power output is quickly regulated to a target level by generating a pull current or a push current quickly, thereby improving power stability and performance of the SSD.

The memory controller 610 and the flash memory 650 or components of the SSD may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flat-pack (TQFP), System In Package (SIP), Multi Chip Package (MCP), Wafer-level Fabricated Package (WFP), and Wafer-Level Processed Stack Package (WSP). The SSD shown in FIG. 15 may be provided as one of various components of an electronic device, such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, storage as a data center, a device for transmitting and receiving information in a wireless environment, one of various electronic devices constituting a home network, one of various electronic devices constituting a computer network, one of various electronic devices constituting a telematics network, a radio frequency identification (RFID) device, or one of various components constituting a computing system.

A configuration of FIG. 15 is not limited to the SSD, but it is applicable to Universal Flash Storage (UFS).

Figure 16:
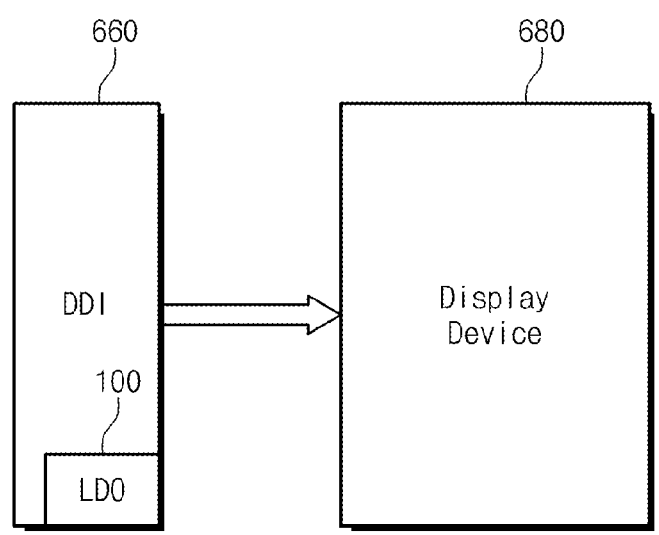
FIG. 16 is a block diagram schematically illustrating an application mounted on a Display Driver IC, according to an exemplary embodiment of the disclosure.

FIG. 16 is a block diagram schematically illustrating an application mounted on a Display Driver IC (DDI), according to an exemplary embodiment of the disclosure.

Referring to FIG. 16, a Display Driver IC (DDI) 660 for driving a display device 680 includes a low drop-out voltage regulator 100 shown in FIG. 1. The DDI 660 stably receives a necessary power output from the low drop-out voltage regulator 100 having an operating characteristic of a fast push-pull driver 150 as described above. Accordingly, power stability and operation-related performance of the DDI 660 are improved.

Figure 17:
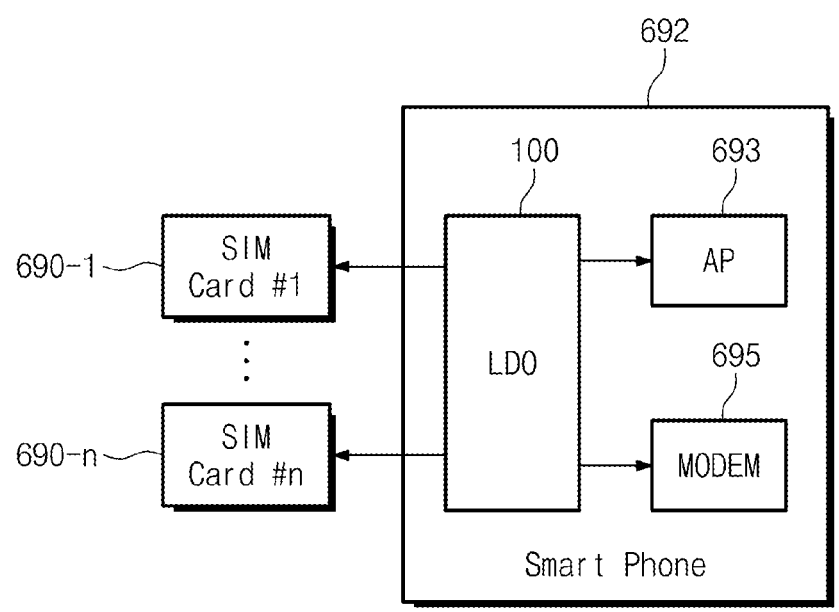
FIG. 17 is a block diagram schematically illustrating an application connected with a smart card, according to an exemplary embodiment of the disclosure.

FIG. 17 is a block diagram schematically illustrating an application connected with a smart card, according to an exemplary embodiment of the disclosure.

Referring to FIG. 17, if a smart phone 692 is equipped with a plurality of SIM cards 690-1 to 690-n, the SIM cards 690-1 to 690-n are supplied with a power output from a low drop-out voltage regulator 100 that receives battery power of the smart phone 692 to perform a voltage regulating operation. In this case, the SIM cards 690-1 to 690-n stably receive a power output from a low drop-out voltage regulator 100 having an operating characteristic of a fast push-pull driver 150, as described above. Accordingly, power stability and performance of a smart card are improved. The power output of the low drop-out voltage regulator 100 is applied to an application processor 693 and a modem 695.

A bus between the SIM cards 690-1 to 690-n and the smart phone 692 may be a communication bus based on at least one of a variety of interface protocols, such as, but not limited to, a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, or an Integrated Drive Electronics (IDE) protocol.

Figure 18:
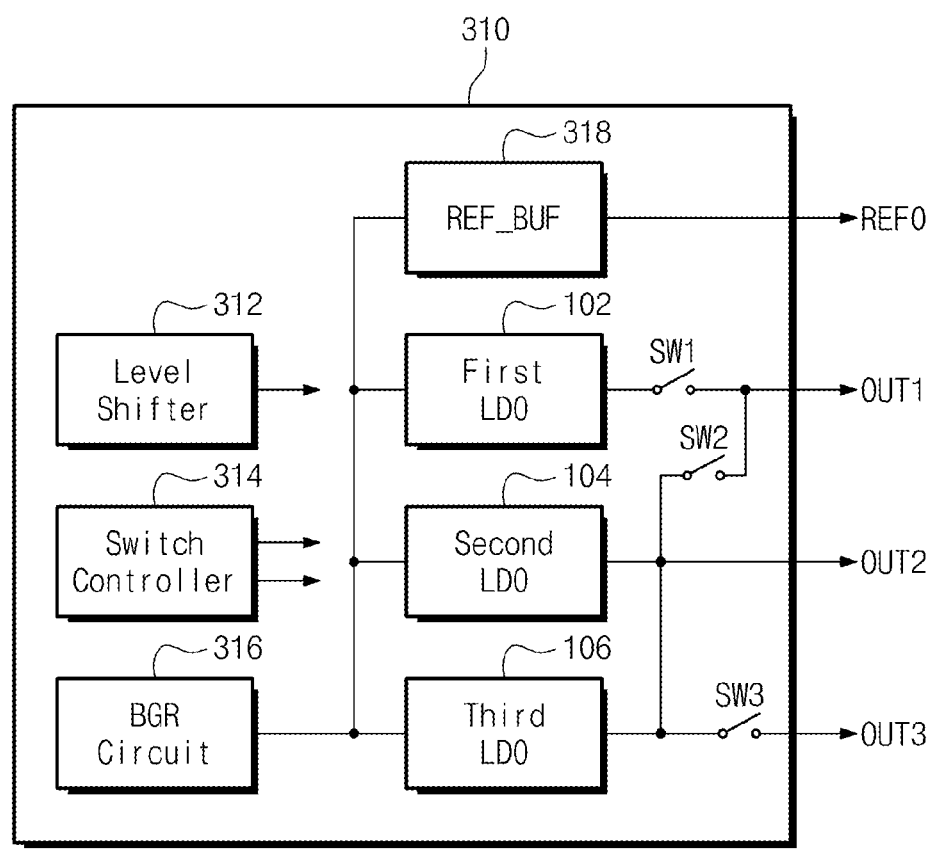
FIG. 18 is a block diagram schematically illustrating an application of a capacitor-less type of low drop-out voltage regulator for a memory controller.

FIG. 18 is a block diagram schematically illustrating an application of a capacitor-less type of low drop-out voltage regulator for a memory controller.

Referring to FIG. 18, a chip 310 contains a level shifter 312 for level shifting of an input power, a switch controller 314 for managing an output power, a bandgap reference circuit 316 for generating a reference voltage, a reference buffer 318 for outputting a buffered reference voltage, a first LDO 102, a second LDO 104, and a third LDO 106. Here, the first, second, and third LDOs 102, 104, and 106 may be implemented with a low drop-out voltage regulator 100 shown in FIG. 1. Eventually, as for FIG. 2 or 3, the low drop-out voltage regulator 100 having a fast push-pull driver 150 supplies various power outputs needed for a memory controller 610. Thus, the low drop-out voltage regulator 100 may minimize or reduce undershoot or overshoot of the power output due to a load variation of the memory controller 610 within a fast time. In particular, for a capacitor-less type memory controller, a stable power output with fast response is provided from the first, second, and third LDOs 102, 104, and 106. Accordingly, power stability and access-related performance of the memory controller are improved.

In FIG. 18, a first power output OUT1 is obtained from one of the first, second, and third LDOs 102, 104, and 106 by the switch controller 314 through controlling first and second switches SW1 and SW2. A second power output OUT2 is obtained from one of the first, second, and third LDOs 102, 104, and 106 by the switch controller 314 through controlling the first and second switches SW1 and SW2. A third power output OUT3 is obtained from one of the first, second, and third LDOs 102, 104, and 106 by the switch controller 314 through controlling the first, second, and third switches SW1, SW2, SW3.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

For example, a fast push-pull driver forming a sub-feedback loop of a voltage regulator may be formed of inverter-type amplifiers.

However, the scope and spirit of the disclosure may not be limited thereto. For example, a detailed circuit connection of amplifiers or the number of amplifier stages may be variously implemented.

What is claimed is:

1. A voltage regulator comprising:
a pass element having a power input connected to a voltage source, a power output connected to a load, and a control input;
a buffer having an input and having an output connected to the control input of the pass element;
an error amplifier forming a first feedback loop together with the pass element and the buffer and having a positive input connected to a sampled voltage of the power output of the pass element, a negative input connected to a reference voltage, and an output connected to the input of the buffer; and
a fast push-pull driver connected between the power output and the control input of the pass element in an inverter type amplification structure and configured to reduce a negative peak and a positive peak of the power output due to a variation in the load at a speed faster than a voltage regulating speed of the first feedback loop.

2. The voltage regulator of claim 1, wherein the fast push-pull driver forms a second feedback loop together with the pass element, an operating speed of the second feedback loop being faster than an operating speed of the first feedback loop.

3. The voltage regulator of claim 1, wherein the fast push-pull driver comprises:

a first amplifier of an inverter type and configured to generate an inverting output in response to the power output of the pass element; and
a second amplifier of the inverter type and configured to generate a push driving current or a pull driving current for controlling a voltage level of the control input in response to the inverting output.

4. The voltage regulator of claim 3, wherein the fast push-pull driver further comprises a high-pass filter connected to the power output of the pass element and configured to perform alternating current (AC) coupling.

5. The voltage regulator of claim 4, wherein:
the first amplifier comprises a first PMOS transistor having a source connected to a power supply voltage, a gate connected to the power output, and a drain connected to the inverting output; and a first NMOS transistor having a drain connected to the inverting output, a gate connected to the power output, and a source connected to a ground voltage, and
the second amplifier comprises a second PMOS transistor having a source connected to the power supply voltage, a gate connected to the inverting output, and a drain connected to the control input; and a second NMOS transistor having a drain connected to the control input, a gate connected to the inverting output, and a source connected to the ground voltage.

6. The voltage regulator of claim 4, wherein:
the first amplifier comprises a first current source connected to a power supply voltage; a first PMOS transistor having a source connected to an output of the first current source, a gate connected to the power output, and a drain connected to the inverting output; a first NMOS transistor having a drain connected to the inverting output and a gate connected to the power output; and a second current source connected between a source of the first NMOS transistor and a ground voltage, and
the second amplifier comprises a third current source connected to the power supply voltage; a second PMOS transistor having a source connected to an output of the second current source, a gate connected to the inverting output, and a drain connected to the control input; a second NMOS transistor having a drain connected to the control input and a gate connected to the inverting output; and a fourth current source connected between a source of the second NMOS transistor and the ground voltage.

7. The voltage regulator of claim 4, wherein:
the first amplifier comprises a first PMOS transistor having a source connected to a power supply voltage and a gate connected to the power output; a third PMOS transistor having a source connected to a drain of the first PMOS transistor, a gate connected to the power output, and a drain connected to the inverting output; a first NMOS transistor having a gate connected to the power output and a source connected to a ground voltage; and a third NMOS transistor having a drain connected to the inverting output, a gate connected to the power output, and a source connected to a drain of the first NMOS transistor; and
the second amplifier comprises a second PMOS transistor having a source connected to the power supply voltage and a gate connected to the inverting output; a fourth PMOS transistor having a source connected to a drain of the second PMOS transistor, a gate connected to the inverting output, and a drain connected to the control input; a second NMOS transistor having a gate connected to the inverting output and a source connected to the ground voltage; and a fourth NMOS transistor having a drain connected to the control input, a gate connected to the inverting output, and a source connected to a drain of the second NMOS transistor.

8. The voltage regulator of claim 4, wherein:
the first amplifier comprises a first PMOS transistor having a source connected to a power supply voltage and a gate connected to the power output; a third PMOS transistor having a source connected to a drain of the first PMOS transistor, a gate connected to a first control voltage, and a drain connected to the inverting output; a first NMOS transistor having a gate connected to the power output and a source connected to a ground voltage; and a third NMOS transistor having a drain connected to the inverting output, a gate connected to a second control voltage, and a source connected to a drain of the first NMOS transistor; and
the second amplifier comprises a second PMOS transistor having a source connected to the power supply voltage and a gate connected to the inverting output; a fourth PMOS transistor having a source connected to a drain of the second PMOS transistor, a gate connected to the first control voltage, and a drain connected to the control input; a second NMOS transistor having a gate connected to the inverting output and a source connected to the ground voltage; and a fourth NMOS transistor having a drain connected to the control input, a gate connected to the second control voltage, and a source connected to a drain of the second NMOS transistor.

9. The voltage regulator of claim 4, wherein:
the first amplifier comprises a first PMOS transistor having a source connected to a power supply voltage and a gate connected to the power output; a third PMOS transistor having a source connected to a drain of the first PMOS transistor and a gate connected to the power output; a first NMOS transistor having a gate connected to the power output and a source connected to a ground voltage; and a third NMOS transistor having a drain connected to a drain of the third PMOS transistor, a gate connected to the power output, and a source connected to a drain of the first NMOS transistor; and
the second amplifier comprises a second PMOS transistor having a source connected to the power supply voltage, a gate connected to the drain of the first PMOS transistor, and a drain connected to the control input; and a second NMOS transistor having a gate connected to the drain of the first NMOS transistor, a drain connected to the control input, and a source connected to the ground voltage.

10. The voltage regulator of claim 1, further comprising a frequency compensation element connected between the power output of the pass element and the input of the buffer and configured to stabilize a frequency of a whole circuit loop.

11. A voltage regulator comprising:
a pass element having a power input connected to a voltage source, a power output connected to a load, and a control input;
a buffer having an input and having an output connected to the control input of the pass element;
an error amplifier forming a first feedback loop together with the pass element and the buffer and having a positive input connected to a divided voltage of the power output of the pass element, a negative input connected to a reference voltage, and an output connected to an input of the buffer; and
a fast push-pull driver connected between the power output and the control input of the pass element in an inverter type amplification structure and configured to regulate the power output at a speed faster than a regulating speed of the first feedback loop while alternating current (AC) coupling the power output when an undershoot and an overshoot of the power output occur due to a variation in the load.

12. The voltage regulator of claim 11, wherein the pass element comprises a PMOS transistor having a source connected to the power input, a drain connected to the power output, and a gate connected to the control input.

13. The voltage regulator of claim 12, wherein the buffer has a source follower circuit structure to relieve a slew limitation according to a variation in the power output and to respond at a high speed at a wide band.

14. The voltage regulator of claim 13, wherein the error amplifier comprises a differential amplifier configured to compare voltages of the positive and negative inputs and amplify a difference between the voltages of the positive and negative inputs.

15. The voltage regulator of claim 11, wherein:
the fast push-pull driver forms a second feedback loop together with the pass element, an operating response of the second feedback loop being faster than that of the first feedback loop, and
the first feedback loop functions as a direct current (DC) feedback loop and the second feedback loop functions as an AC feedback loop.

16. A low drop-out voltage regulator comprising:
a pass element configured to pass a power input to a power output connected to a load in response to a voltage on a control input;
a voltage divider configured to divide the power output according to a designated resistance ratio to generate a division output;
a buffer having an input and having an output connected to the control input of the pass element;
an error amplifier forming a first feedback loop together with the pass element and the buffer and configured to compare and amplify a voltage of a positive input connected to the division output of the voltage divider and a voltage of a negative input connected to an input reference voltage, an output of the error amplifier being provided as an input of the buffer; and
a fast push-pull driver having an inverter type amplification structure and configured to regulate the power output to a target voltage at a speed faster than a voltage regulating speed of the first feedback loop, when a negative peak or a positive peak deviating from the target voltage of the power output occurs due to a variation in the load.

17. The low drop-out voltage regulator of claim 16, wherein the low drop-out voltage regulator is installed in a package of a system on chip.

18. The low drop-out voltage regulator of claim 16, wherein the voltage divider comprises:
a first resistor having one end connected to the power output; and
a second resistor connected between the other end of the first resistor, from which the division voltage is generated, and a ground voltage.

19. The low drop-out voltage regulator of claim 16, wherein the fast push-pull driver has cascaded amplifiers of an inverter type and driving push and pull currents, the number of stages of the cascaded amplifiers being at least two or more.

20. The low drop-out voltage regulator of claim 19, wherein the fast push-pull driver further comprises a high-pass filter configured to alternating current (AC) couple the power output of the pass element using a capacitor and a resistor.

* * * * *